(12) United States Patent
Motakef et al.

(10) Patent No.: US 7,377,977 B2
(45) Date of Patent: May 27, 2008

(54) HIGH-PURITY CRYSTAL GROWTH

(75) Inventors: Shariar Motakef, Weston, MA (US);
Aniruddha S. Worlikar, Norwood, MA (US)

(73) Assignee: Cape Simulations, Inc., Natick, MA (US)

( * ) Notice: Subject to any disclaimer, the term of this patent is extended or adjusted under 35 U.S.C. 154(b) by 0 days.

(21) Appl. No.: 11/443,895

(22) Filed: May 30, 2006

(65) Prior Publication Data
US 2007/0107654 A1    May 17, 2007

Related U.S. Application Data

(63) Continuation of application No. 10/650,530, filed on Aug. 28, 2003, now Pat. No. 7,052,546.

(51) Int. Cl.
*C30B 35/00* (2006.01)
*C23C 16/54* (2006.01)

(52) U.S. Cl. .............. 117/86; 117/88; 117/89; 117/200; 117/951; 118/719; 118/725; 427/249.15

(58) Field of Classification Search .......... 117/86, 117/88, 89, 200, 951; 118/719, 725; 427/249.15
See application file for complete search history.

(56) References Cited

U.S. PATENT DOCUMENTS

| | | | |
|---|---|---|---|
| 5,704,985 A | 1/1998 | Kordina et al. | 118/725 |
| 5,879,462 A | 3/1999 | Kordina et al. | 118/725 |
| 6,030,661 A | 2/2000 | Kordina et al. | 427/248.1 |
| 6,039,812 A | 3/2000 | Ellison et al. | 118/725 |
| 6,048,398 A | 4/2000 | Vehanen et al. | 117/200 |
| 6,299,683 B1 | 10/2001 | Rupp et al. | 117/88 |
| 6,461,944 B2 | 10/2002 | Neudeck et al. | 438/478 |
| 6,613,695 B2 | 9/2003 | Pomarede et al. | 438/767 |
| 6,692,568 B2 | 2/2004 | Cuomo et al. | 117/84 |

*Primary Examiner*—Felisa Hiteshew
(74) *Attorney, Agent, or Firm*—Mintz, Levin, Cohn, Ferris, Glovsky and Popeo, P.C.

(57) ABSTRACT

A method of growing a crystal on a substrate disposed in a reactor, that provides a reactor chamber in which the substrate is disposed, includes flowing reactive gases inside the reactor chamber toward the substrate, the reactive gases comprising components that are able to bond to each other to form the crystal, and flowing buffer gas in the reactor chamber between the reactive gases and a wall of the reactor, where the flowing buffer gas inhibits at least one of a first material at least one of in and produced by the reactive gases from reaching the reactor wall and a second material produced by the reactor wall from reaching the reactive gases in the reactor chamber before the reactive gases reach the substrate.

15 Claims, 8 Drawing Sheets

HIGH-PURITY CRYSTAL GROWTH

This application is a CON of Ser. No. 10/650,530 Aug. 28, 2003 U.S. Pat. No. 7,052,546.

STATEMENT AS TO FEDERALLY-SPONSORED RESEARCH

This invention was made at least in part with Government support under Grant No. F33615-02-M-5422, awarded by the United States Air Force. The Government has certain rights in this invention.

CROSS-REFERENCE TO RELATED APPLICATIONS

This application is a Continuation of U.S. patent application Ser. No. 10/650,530, filed Aug. 28, 2003, now U.S. Pat. No. 7,052,546, which is incorporated herein in its entirety.

FIELD OF THE INVENTION

The invention relates to growth of single crystals and more particularly to growth of crystals of silicon carbide and group III-nitrides, and alloys thereof.

BACKGROUND OF THE INVENTION

It is very difficult to grow silicon carbide (SiC), group III-nitrides, and alloys thereof, with low impurity levels, high crystalline quality, and commercially-viable growth rates. The discussion below, for exemplary purposes only, focuses on the growth of SiC crystals, but this does not limit the scope of the invention.

SiC single crystals have unique electronic and physical properties, making them suitable for use in different types of semiconductor devices. SiC devices can operate at significantly higher temperatures than devices built using more conventional electronic materials such as silicon (Si) or gallium arsenide (GaAs). SiC has a very high electric breakdown field, making it suitable for high power communications devices operating in the microwave frequency spectrum. Furthermore, the thermal conductivity of SiC is significantly higher than that of Si and GaAs, allowing for a more efficient removal of thermal energy generated during the operation of semiconductor devices. This is particularly advantageous for high-power and high-frequency semiconductor devices.

To help improve the performance of SiC semiconductor devices in general, and microwave devices in particular, it is desirable to have low levels of background impurities in the SiC crystal. This is especially true for microwave devices, that use high-resistivity, semi-insulating substrates (with resistivity greater than about 1E05 $\Omega$-cm) to help avoid problems associated with electrically-conductive substrates.

An approach to growing crystals is to replace the powder source in the PVT (Physical Vapor Transport) process with high-purity gases. High concentrations of precursor gases (such as silane and propane) are used instead of the powder source to produce Si- and C-carrying vapor species. For example, a mixture of silane, a hydrocarbon gas such as propane, and a carrier gas such as helium is pumped into the base of a cylindrical reactor that is heated externally, and that includes a wafer of SiC acting as a seed for crystal growth on the top flat surface of the cylindrical reactor. Silane decomposes to $Si_x$ and $H_2$, and because a high concentration of silane is used, $Si_x$ clusters are formed. The $Si_x$ clusters react with propane to form thermodynamically-stable $Si_xC_y$ clusters, and more $H_2$. The gas stream containing the clusters enters a higher temperature region, where the clusters sublime to form vapor species containing Si and C (Si, $SiC_2$, $Si_2C$, and SiC). These vapor species are transported towards the growing surface by the bulk motion of the gas and decompose to form crystalline SiC on the lower-temperature seed surface. This method has been referred to as High Temperature Chemical Vapor Deposition (HTCVD) or Gas Fed Sublimation (GFS), and has been shown to produce high-purity materials at high growth rates. Compositional purity of materials grown by this technique is very high, orders of magnitude higher than that obtained in standard PVT-grown materials (carrier concentration of $10^{15}$ versus $10^{17}$ cm$^{-3}$). The high purity of HTCVD materials may be related to the use of gas precursors instead of powder source material, that can be obtained at much higher purity levels than the solid source. Impurities such as boron and nitrogen, however, have been detected in the grown materials. The source of these impurities is believed to be the reactor walls and components.

At the elevated temperatures used in the GFS process for growth of SiC, graphite is believed to be the only material that is thermally, chemically, and economically suitable for construction of the reactor components, such as the containment walls, seed holder, etc. Although high purity graphite is generally used for the construction of reactors, the high processing temperature (2000-2500° C.) results in release of residual impurities from the graphite components. These impurities effuse into the gas stream and contaminate the growing SiC crystal. Impurities such as boron and nitrogen have been detected in the grown materials. The source of these impurities is believed to be the reactor walls and components. One approach to reduce the release of impurities from graphite components is to coat them with a high purity coating, such as SiC.

During GFS, the cracking and reactions of Si- and C-carrying precursor gases produce hydrogen. At high temperatures, hydrogen is highly reactive and reacts with silicon carbide, with the etching rate being significantly faster for polycrystals than single-crystals. Hydrogen has a beneficial effect at the growth surface, where it etches away polycrystals that may be formed on that surface, while leaving the single crystal portions less affected. In cases where the precursors do not produce any hydrogen or the amount produced is not enough, controlled amounts of hydrogen may be added to the gas mixture at the inlet to the reactor to control the etching action of the gas mixture. A deleterious side-effect of the presence of hydrogen in the reactor is its reaction with the silicon-carbide coating of the graphite reactor components, thus exposing the underlying graphite. The presence of nitrogen and boron in the GFS-grown SiC is related to the release of these impurities from the hot, exposed graphite.

In the GFS process, the reactive gas mixture is pumped into a reactor that is heated by an external source, typically radio frequency induction. The gas mixture is heated through contact with the hot walls of the reactor and subsequent diffusion of heat through the gas mixture. In general, the concentration of Si- and C-carrying precursors relative to the carrier gas is relatively low, and heat and mass transfer in the reactor is controlled by the thermophysical properties of the carrier gas. The thermophysical properties of the carrier gases which can be used (e.g. Helium, Argon etc) are such that heat diffuses at nearly the same rate as which hydrogen diffuses through the gas mixture. As the rate of gas-phase reactions increases rapidly with temperature (with a corresponding increase in the rate of release of hydrogen), by the time heat has diffused to the central portion of the gas mixture and heated it to the desired temperature, the formed hydrogen has diffused to the reactor wall, and started to etch away the silicon carbide coating of the reactor wall.

The above problems associated with release of impurities and diffusion of the impurities into the gas core are also present when the impurities are released from the reactor walls without the action of a component of the gas mixture on the reactor wall. Examples of such incidences would be the release of impurities from the reactor wall or its coating because of the high operating temperatures, or diffusion of impurities from other components in the reactor into the reactor wall and subsequent effusion into the gas mixture. In such circumstances, the diffusivity of typical impurities (for example nitrogen) is nearly the same as diffusivity of heat in the gas mixture.

SUMMARY OF THE INVENTION

In general, in an aspect, the invention provides a method of growing a crystal on a substrate disposed in a reactor that provides a reactor chamber in which the substrate is disposed. The method includes flowing reactive gases inside the reactor chamber toward the substrate, the reactive gases comprising components that are able to bond to each other to form the crystal, heating a buffer gas, and flowing the heated buffer gas in the reactor chamber between the reactive gases and a wall of the reactor such that the reactive gases and the buffer gas can interact, where the flowing buffer gas inhibits at least one of a first material at least one of in and produced by the reactive gases from reaching the reactor wall and a second material produced by the reactor wall from reaching the reactive gases in the reactor chamber before the reactive gases reach the substrate.

Implementations of the invention may include one or more of the following features. The method further includes using the buffer gas to heat the reactive gases sufficiently to react to form a desired material before reaching the substrate, the desired material for forming a desired crystal on the substrate. The method further includes expelling unused portions of the reactive gases and the buffer gas from the chamber, wherein the buffer gas flows at a speed such that substantially none of the first material reaches the reactor wall and substantially none of the second material reaches the reactive gases inside the reactor chamber. The buffer gas comprises at least a third material configured to react with at least one of the first and second materials to form at least one inert, stable material. The buffer gas comprises at least one inert gas. The at least one inert gas comprises at least one of helium and argon.

Also, Implementations of the invention may include one or more of the following features. The reactive gases comprise at least one of a dopant and an etchant that will react with the reactor wall to produce the second material. The reactive gases comprise the etchant and the etchant is hydrogen. The reactive gases include at least one of silane, silicon tetrachloride, and trimethylsilane, and at least one of methane and propane. The method further includes heating the reactor wall. At least one of the reactor wall, the buffer gas, and the substrate seat is heated to control a temperature difference between a temperature of the reactive gases and a temperature of the substrate. The difference is maintained between about 5° C. and about 200° C.

Also, implementations of the invention may include one or more of the following features. The method further includes mixing all components of the reactive gases before flowing the reactive gases in the reactor chamber. The method further includes flowing components of the reactive gases separately into the reactor chamber to inhibit mixing of the components prior to introduction into the chamber. The method further includes expelling the buffer gas at least one of in a direction parallel to an axis of the reactor and through at least one opening defined in the reactor wall. The reactive gases comprise one of the following groups of elements: silicon and carbon, aluminum and nitrogen, gallium and nitrogen, aluminum and gallium and nitrogen, and alloys of any of the preceding groups. The reactive gases include gases for growing crystals of at least one of SiC, a group III-V compound, and an alloy of SiC or a group III-V compound.

In general, in another aspect, the invention provides a reactor system for growing a crystal on a substrate, the reactor system including a housing comprising a first, inlet end, and a second, outlet end, the inlet end defining a reactive stream intake port and a buffer stream intake port, the outlet end defining at least one output port, a base coupled to the outlet end of the housing and configured to receive the substrate, a reactive gas injector configured to inject reactive gases into the housing through the reactive stream intake port to produce a reactive stream of the reactive gases, a buffer gas injector configured to inject buffer gas into the housing through the buffer stream intake port to produce a buffer stream of the buffer gas, and a first heat source configured and disposed to heat the buffer stream, where the inlet end, the reactive gas injector, and the buffer gas injector are configured such that the heated buffer stream is disposed between the reactive stream and a wall of the housing and inhibits components of or produced in the reactive stream from reaching the housing wall and inhibits materials produced or emitted by the housing wall from reaching the reactive stream before the reactive stream reaches the substrate.

Implementations of the invention may include one or more of the following features. The inlet end is configured to keep the reactive stream and the heated buffer stream separate until an interaction location inside the housing. The system further includes a second heat source configured and disposed to heat the housing wall substantially between points even with the interaction location and the substrate. The first heat source is configured to heat the buffer stream to a sufficient temperature such that when the buffer stream interacts with the reactive stream, the buffer stream will heat the reactive stream enough to cause the reactive gases to react with each other to form a desired material before reaching the substrate, the desired material for forming a desired crystal on the substrate.

Also, implementations of the invention may include one or more of the following features. The system further includes a substrate-heating source configured and disposed to heat the substrate to maintain a temperature difference between a temperature of the reactive stream and a temperature of the substrate. The difference is maintained between about 5° C. and about 200° C. The housing defines at least one opening in the housing wall along a length of the housing. The housing defines a plurality of openings in the housing wall along the length of the housing and wherein sizes of the openings provide modulated outflow of at least the buffer gas from the housing along the length of the housing. The system further includes an outer shell disposed about and separated from the housing along the length of the housing to define a passageway between the shell and the housing, and an apparatus configured and disposed to induce flow of gas out of the passageway.

In general, in another aspect, the invention provides a reactor system for growing a crystal on a substrate, the reactor system including a housing comprising a first, inlet end, and a second, outlet end, the inlet end defining a reactive stream intake port, the outlet end defining at least one output port, a base coupled to the outlet end of the housing and configured to receive the substrate, an apparatus configured and disposed to provide a gas flow into the housing through the reactive stream intake port, and means for heating the gas flow between the intake port and the substrate and for isolating at least one of the gas flow components from a wall of the housing and materials emitted from the housing wall from the gas flow, where the means for heating the gas flow is configured to do so independently of heat emanating from the housing wall.

Implementations of the invention may include one or more of the following features. The means for heating is configured to inject a heated stream of at least one buffer gas that is unlikely to react with the gas flow components, the at least one buffer gas being at a sufficient temperature to heat the gas flow components enough such that gas flow components will react with each other. The system further includes means for heating the housing wall. The system further includes means for heating the substrate to maintain a desired temperature difference between a maximum temperature of the gas flow and a temperature of the substrate. The desired temperature difference is between about 5° C. and about 200° C.

Also, implementations of the invention may include one or more of the following features. The housing defines at least one opening in the housing wall along a length of the housing. The housing defines a plurality of openings in the housing wall with different sizes along the length of the housing. The system further includes an outer shell disposed about and separated from the housing along the length of the housing to define a passageway between the shell and the housing, and an apparatus configured and disposed to induce flow of gas out of the passageway.

Various aspects of the invention may provide one or more of the following advantages. High purity SiC, group III nitrides, and alloys thereof may be grown at commercially sufficient speeds. Impurities may be inhibited from reaching a stream of gases for growing crystals. Reactive gases for growing crystals may be heated while inhibiting contact of the gases with a growth chamber wall. Temperature differences between a growing crystal and reactive gases may be controlled and held below a desired threshold. These and other advantages of the invention, along with the invention itself, will be more fully understood after a review of the following figures, detailed description, and claims.

DETAILED DESCRIPTION OF PREFERRED EMBODIMENTS

Embodiments of the invention provide techniques for growing high purity SiC, group III nitrides and alloys thereof, other group IV compounds, and other group III-V compounds, etc. For example, aluminum nitride (AlN), gallium nitride (GaN), silicon carbide (SiC), aluminum gallium nitride (AlGaN), and other crystal compounds may be formed using the invention. For SiC crystals, a reactive gas mixture of Si- and C-carrying gases and an inert carrier gas are injected through a water-cooled inlet into a central core of a reactor. For growing other crystals, other reactive gases may be used. A buffer gas stream is preheated to a high temperature and is introduced into the reactor and flows over a wall of the reactor and parallel to the reactive stream. This buffer stream separates the reactor wall from the reactive gas mixture flowing in the central core of the reactor. The reactive stream is heated by heat from the buffer stream to induce desired chemical reactions. Hydrogen produced by these reactions is inhibited from reaching the reactor wall, and exhausted from the reactor, by the buffer stream. Further, impurities emanating from the reactor wall are inhibited from reaching the reactive stream, and exhausted from the reactor, by the buffer stream.

Figure 1:
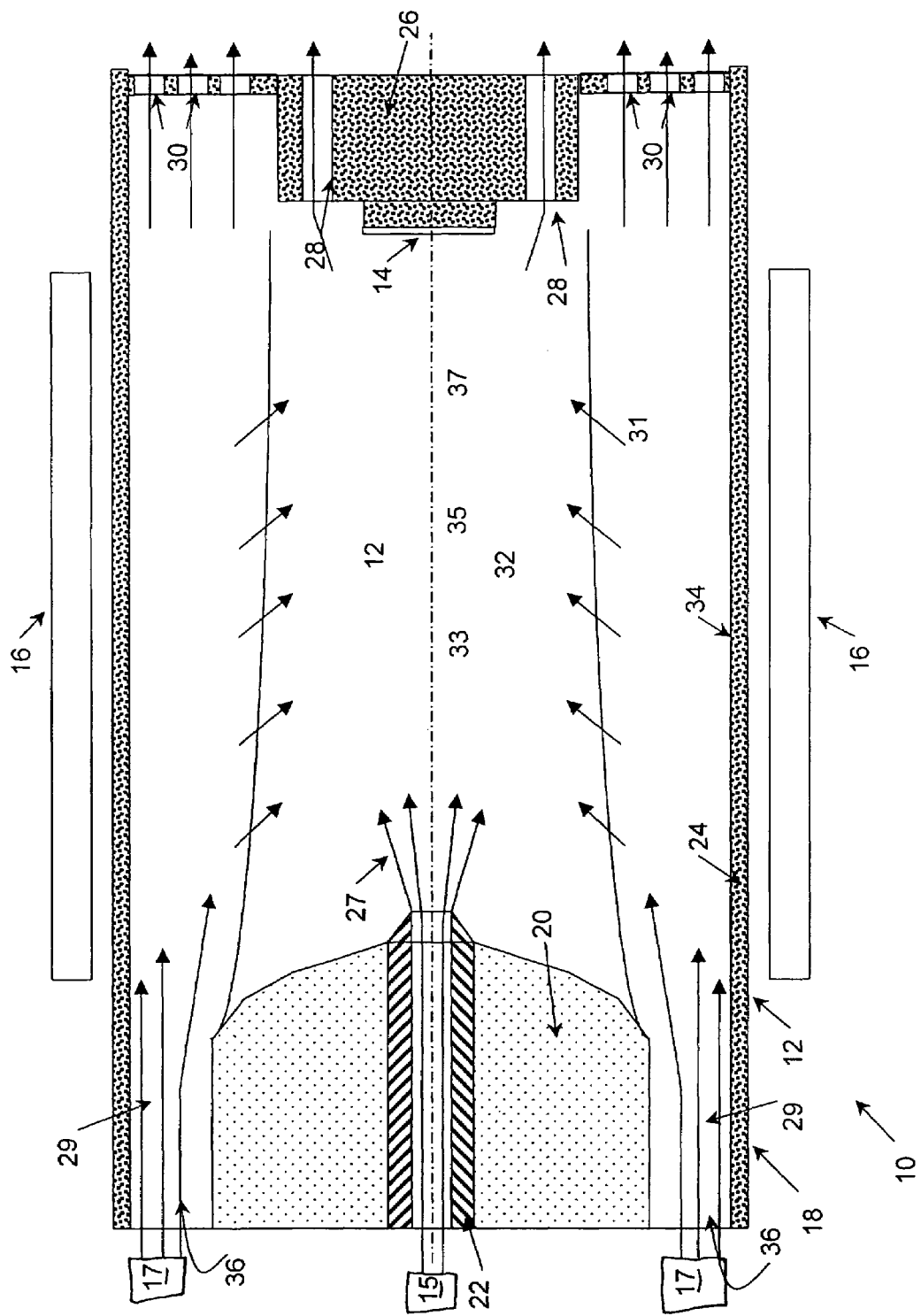
FIG. 1 is a cross-section of a reactor and illustrates flow paths of a reactive gas mixture and a pre-heated buffer gas stream in the reactor.

Referring to FIG. 1, a crystal growth system 10 includes a reactor 12, a seed 14, a reactive-gas injector 15, a buffer gas injector 17, and a heating element 16, with the reactor 12 including a housing or body 18, a thermal insulator 20, and an inlet tube 22. The body 18 includes a reactor wall 24, and a seed holder 26, and provides reactive stream exhaust ports 28 and buffer stream exhaust ports 30. The system 10 is configured to grow high-purity crystals on the seed 14 mounted on the seed holder 26, while inhibiting impurities from reaching the seed 14. For example, impurities may be inhibited from reaching the seed 14 by removing the impurities with a buffer stream 29 and/or by limiting use of materials that may react to produce impurities. The seed holder 26 is configured and disposed to hold the seed 14 in position to receive gases from the inlet tube 22. While the description below of the system 10 focuses on configuration and uses of the system 10 for growing SiC crystals, the system 10 can be configured and used to grow other compositions of crystals, e.g., group III nitrides and alloys thereof.

The reactor housing 18 is preferably a cylindrical container made of graphite. The housing provides a chamber 32 for combining materials in order to form and deposit desired compounds on the seed 14. A coating 34 is provided on the inside surface of the wall 24. This coating is preferably SiC and is configured to inhibit impurities from emanating from the wall 24 and to inhibit hydrogen from reacting with the wall 24 to produce impurities. The housing 18 is configured to withstand the high temperatures, e.g., 2500° C., involved in growing desired crystals.

The reactive-gas injector 15 is configured and disposed to provide reactive gases into the inlet tube 22 at a desired flow rate. The injector 15 can hold the reactive gases, e.g., an inert gas (e.g., helium) plus a Si-carrying gas (e.g., silane) and a C-carrying gas (e.g., propane) if SiC crystals are to be grown. The injector 15 can push the reactive gases into the inlet tube 22 to produce a flow of the reactive gases, a reactive stream 27, to allow heating of the reactive gases in the chamber 32 and to ensure that the produced molecules from reactions in the chamber 32 reach the seed 14. The inlet tube 22 preferably is water cooled and has a nozzle at its output end (i.e., into the chamber 32). The tube 22 is cooled to cause the reactive gases to be at a temperature, e.g., room temperature, such that the Si-and C-carrying gases do not undergo any, or any substantial amount of, reactions before entering the chamber 32.

The buffer-gas injector 17 is configured to hold, pre-heat, and inject buffer gases into the chamber 32 through input ports 36 provided by the reactor housing 18 to produce the buffer stream 29. The injector holds the buffer gases, preferably one or more inert gases, and pre-heats the inert buffer gases before injecting them into the chamber 32. The injector 17 is configured to heat the gases to a high temperature, e.g., 2500° C. The injector 17 is further disposed and configured to inject the buffer gas into the chamber 32 between the wall 24 and the reactive stream 27 and at a flow rate sufficient to produce the buffer gas stream 29 that provides a barrier between the wall 24 and the reactive stream 27. The buffer stream 29 enters the reactor 12 coaxially and parallel with the reactive stream 27.

The pre-heated buffer gas stream 29 preferably performs at least three functions. First, it heats the reactive stream 27 to temperatures sufficient for the cracking of Si-and C-carrying gases, to produce and sublime $Si_x$—$C_y$ clusters. The buffer gas stream 29 heats the reactive mixture while keeping the reactive gases and the reactor wall 24 separated. Second, the pre-heated buffer stream 29 provides a diffusion barrier to the transport of hydrogen or other etchants to the reactor wall 24. Hydrogen and/or other etchants may be produced during the chemical reactions of the reactive gases or may be otherwise present in the reactive stream 27. This diffusion barrier helps reduce reaction of etchant gases and the reactor wall 24, and possibly completely eliminate such interaction. Third, the pre-heated buffer stream 29 acts as a diffusion barrier to impurities that may be released from the reactor wall 24, possibly but not exclusively related to the reaction of etchant gases with the reactor wall 24. The buffer gas stream 29 can perform these three functions simultaneously. The buffer gas stream 29 helps isolate the reactive gas stream 27 from the reactor wall 24 in terms of transport of both heat and gaseous species. The buffer gas stream 29 guards against impurities from the reactor wall 24 entering the reactive gas stream 27 and being incorporated into the growing crystal on the seed 14.

The heating element 16, the insulator 20, and a fan or other apparatus are provided to maintain the buffer stream's temperature and flow, and the reactive stream's flow. The insulator is disposed between the buffer stream 29 and the water-cooled inlet tube 22 and thermally isolates the stream 29 from the tube 22. The heating element 16 is disposed downstream from the insulator 20, beyond the entry point of the stream 29, and provides heat to the reactor 12. This heat is transferred through the wall 24 and to the buffer stream 29 to help guard against energy loss in the buffer stream 29. The heating element 16 may be, e.g., a radio frequency (RF) inductor. A fan or other apparatus (not shown) is provided to produce a negative pressure relative to that of the chamber 32 to draw the reactive and buffer gases through the exhaust ports 28, 30.

The reactor 12 is sized to be long enough such that the reactive gas stream 27 has time to react to form desired molecules for deposition on the seed 14. The reactor 12 is long enough, in conjunction with the reactive gas stream's flow rate, to allow for the reactive stream 27 to be heated by the buffer stream 29 to sufficient temperatures to induce reaction of the reactive gases. Chemical reactions of the reactive gases will cause $Si_xC_y$ clusters and $Si_xC_y$ in vapor to form. The reactor 12 is preferably long enough such that all or substantially all of the $Si_xC_y$ clusters sublime to the vapor phase.

The seed holder 26 is disposed and configured to hold the seed 14 in position for crystals to be grown on the seed 14. The holder 26 holds the seed 14 in line with the reactive gas stream 27 so that atoms from the reactive gas stream resulting from the reactions in the heated stream 27 are deposited on the seed 14 to form a desired crystal.

Figure 2:
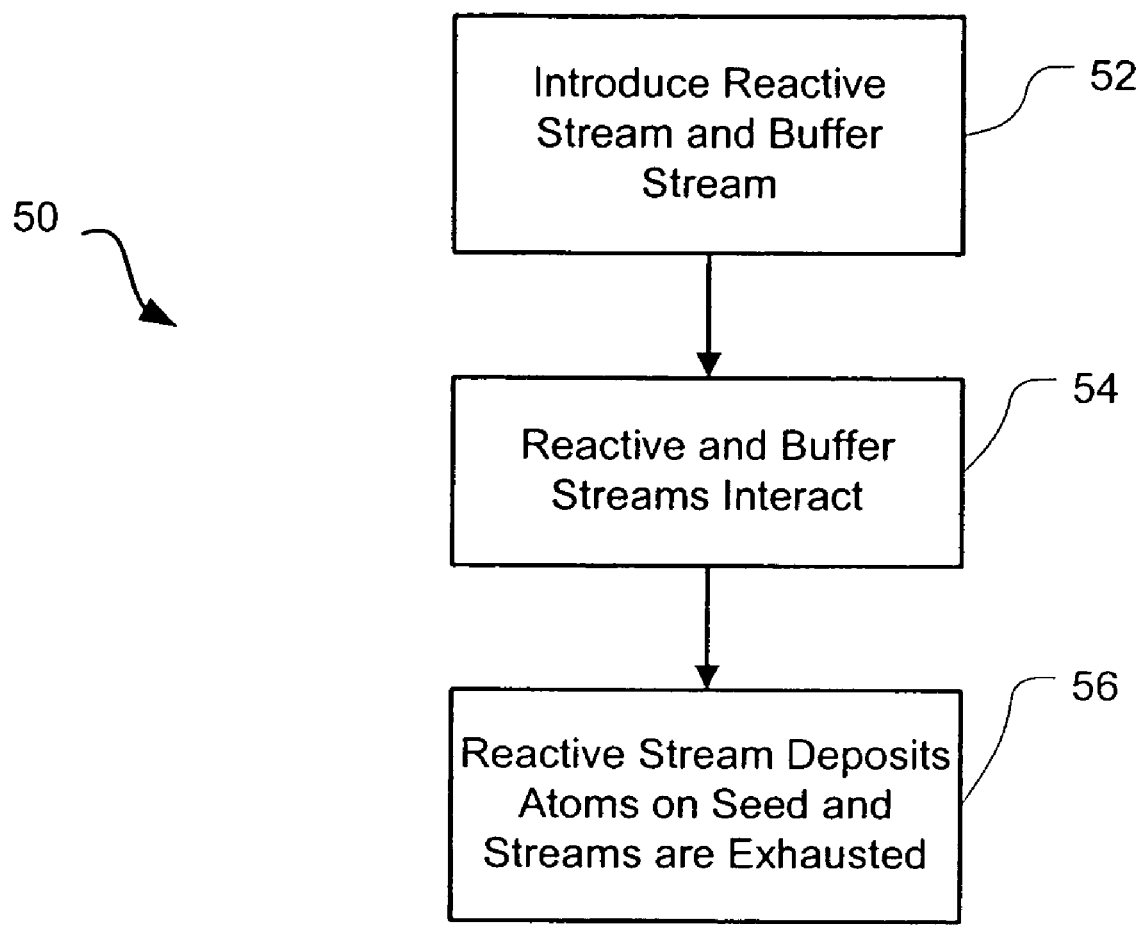
FIG. 2 is a block flow diagram of a process of using the system shown in FIG. 1 to grow a crystal on a substrate.

In operation, referring to FIG. 2, with further reference to FIG. 1, a process 50 for growing a crystal using the system 10 includes the stages shown. The process 50, however, is exemplary only and not limiting. The process 50 can be altered, e.g., by having stages added, removed, or rearranged.

At stage 52, the reactive stream 27 and the buffer stream 29 are introduced into the chamber 32. The buffer gases are heated in the buffer gas injector 17 and injected into the chamber 32. The reactive gases are injected by the injector 15 into the inlet tube 22, through the tube 22, and into the chamber 32.

At stage 54, the reactive gas stream 27 and heat from the buffer gas stream 29 interact. As the two gas streams 27, 29 flow in the reactor 12, heat diffuses from the pre-heated buffer stream 29 to the reactive mixture stream 27 as indicated by arrows 31 in FIG. 1. As the temperature of the reactive mixture increases, the Si- and C-carrying gases undergo chemical reactions forming $Si_xC_y$ clusters and $Si_xC_y$ in vapor form in a region 33 in the chamber 32. As the reactive stream 27 flows toward the seed 14, the reactive stream's temperature continues to increase, through heat transfer from the buffer gas stream 29, preferably to a maximum temperature. The maximum temperature is reached in a region 35 and the reactive gas mixture is sufficiently hot so that preferably, but not necessarily, all remaining $Si_xC_y$ clusters sublime into the vapor phase. The temperature of the stream 27 is preferably, in this exemplary embodiment, between about 2300° C. and about 2600° C. As the reactive mixture stream 27 flows further toward the seed 14, in a region 37 the reactive stream's temperature approaches that of the pre-heated buffer stream 29. Temperatures of both the streams 27, 29 decrease slowly as they approach the seed holder 26.

During stage 54, the buffer stream 29 provides an impurity buffer for the reactive stream 27. The buffer stream 29 inhibits hydrogen produced, or otherwise provided, in the reactive stream 27 from reaching and reacting with the wall 24 to produce impurities. The stream 29 further inhibits impurities, produced from hydrogen reacting with the wall 24 or heating of the wall 24, or otherwise produced by or disposed near the wall 24, from reaching the reactive gas stream 27, preferably at all or at least not above (upstream from) the surface of the seed 14.

At stage 56, the reactive stream 27 deposits atoms on the seed 14 and, along with the buffer stream 29, exits the chamber 32. Above the seed 14, the reactive mixture 27 deposits Si and C atoms onto a surface of the seed 14, resulting in growth of a SiC crystal. The reactive stream 27 is exhausted from the reactor 12 through the exit port 28 disposed around the seed 14. The buffer stream 29 leaves the reactor 12 through the exit port 30 disposed further away from the seed 14 than the exit port 28 and close to the reactor wall 24.

Figure 3:
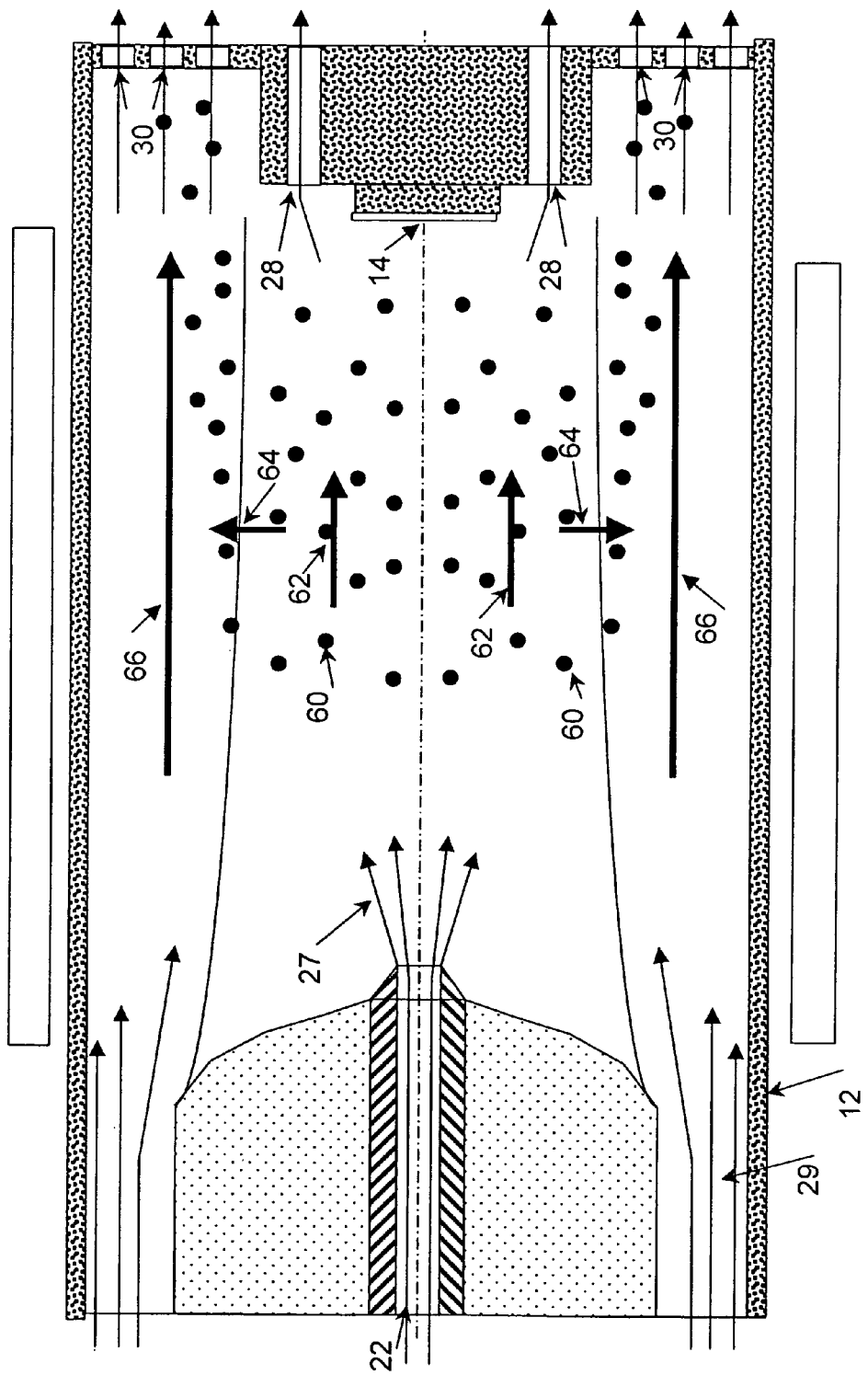
FIG. 3 is a cross-section of the reactor shown in FIG. 1 illustrating an advection path of hydrogen and other etchants present in the reactive gas mixture.

Referring to FIG. 3, exemplary transfer paths of hydrogen produced during the process 50, e.g., in chemical reactions in the reactive mixture at stage 54, are shown. As the reactive stream 27 flows out of the inlet tube 22 and towards the seed 14, the mixture undergoes chemical reactions where, for example, silane reacts to form silicon and hydrogen atoms 60 and the C-carrying gas cracks to form carbon and hydrogen atoms 60. The hydrogen atoms 60 generated during these processes are transferred toward the seed 14 by the bulk motion of the reactive stream 27, as denoted by arrows 62. Hydrogen also diffuses into the adjacent preheated buffer stream 29, as denoted by arrows 64. The flow rate of the pre-heated buffer stream 29 is selected such that, inter alia, the stream 29 urges, directs, or otherwise transfers the diffused hydrogen 60 toward the exits 28, 30 of the reactor 12 and removes the hydrogen 60 from the reactor 12 before the hydrogen 60 reaches the reactor wall 24, as indicated by arrows 66.

Figure 4:
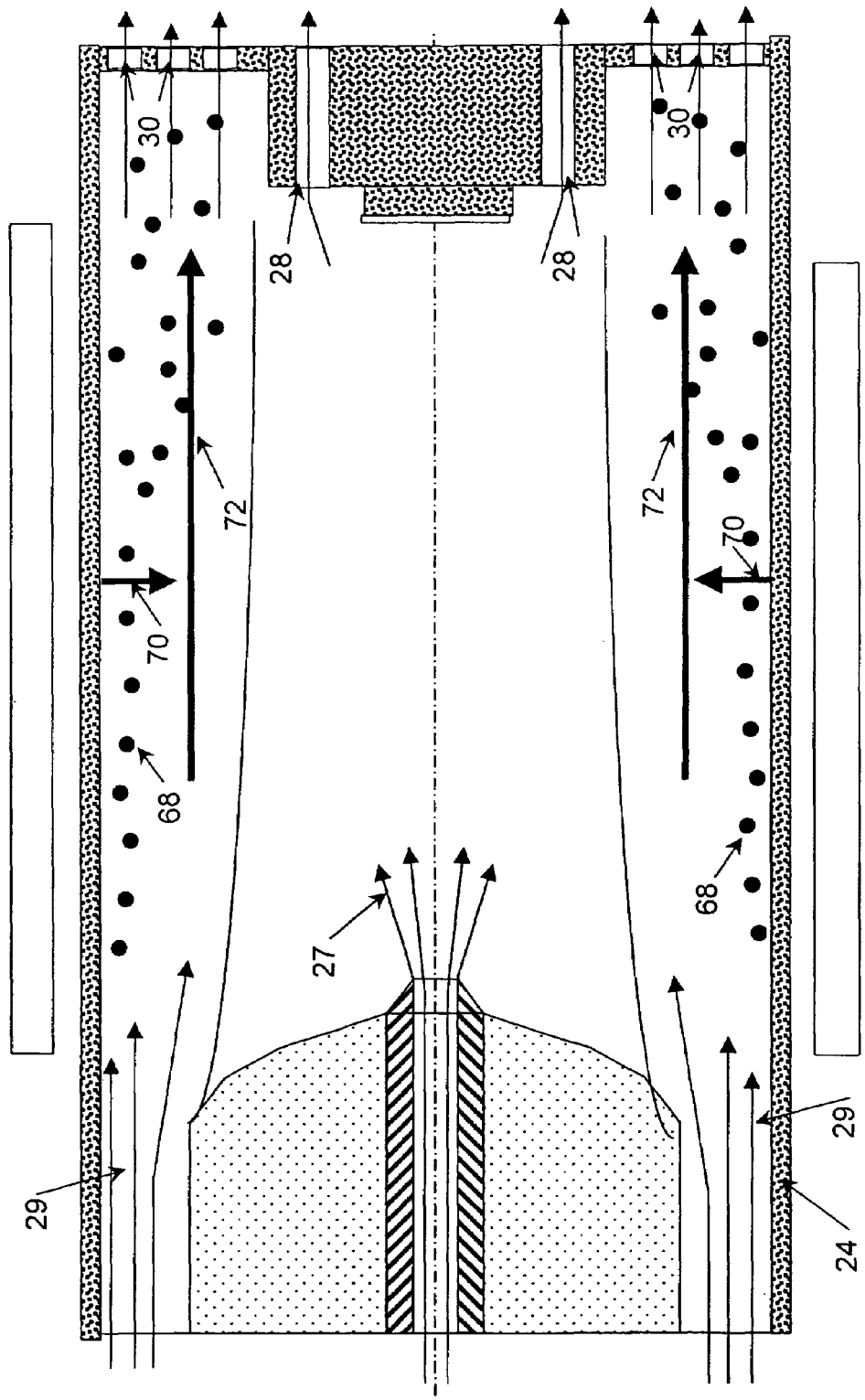
FIG. 4 is a cross-section of the reactor shown in FIG. 1 illustrating diffusion and advection paths of impurities generated at wall of the reactor.

Referring to FIG. 4, exemplary transfer paths of impurities 68 released at the reactor wall 24 are shown. These impurities 68 may be generated by a number of mechanisms, such as the etching of the reactor wall 24 or the reactor wall's coating by hydrogen or other etchants in the reactive mixture, or auto-release of impurities by the reactor wall material. Once generated, these impurities 68 diffuse out of the reactor wall 24 into the pre-heated buffer stream 29, as depicted by arrows 70. The velocity of the pre-heated buffer stream 29 helps ensure that the impurities 68 do not, at least significantly, diffuse into the reactive mixture stream 27 and are transferred by the buffer stream 29 to the exit ports 28, 30, as indicated by arrows 72.

Referring again to FIGS. 1-4, for the process 50 the flow rates of the reactive stream 27 and the buffer stream 29, the inlet temperature of the buffer stream 29, and the geometric features of the reactor 12 are chosen in concert with each other to help achieve desired goals. A first of these goals is to ensure that the reactive mixture gas temperature reaches an appropriate value to induce the reactions and processes to form $Si_xC_y$ vapor species before the mixture arrives at the seed 14. A second goals is to ensure that the time that it takes for the hydrogen 60 present in the reactive stream 27 to diffuse from the reactive mixture to the reactor wall 24 is larger than the time it would take for the buffer stream 29 to remove the hydrogen to the exits 28, 30 of the reactor 12. A third goal is to ensure that the time that it takes for impurities 68 generated at the reactor wall 24 to diffuse across the buffer stream 29 and enter the reactive stream 27 are larger than the time it would take for the buffer stream 29 to direct the impurities 68 to the exits 28, 30 of the reactor 12.

The flow rates of the reactive stream 27 and the buffer stream 29, inlet temperature of the buffer stream 29, and the geometric features of the reactor 12 are preferably selected in concert with each other using well-established laws of energy conservation, momentum transfer, and mass transfer in convective systems. For example, detailed engineering analysis and computer simulation may be performed to determine the desired parameters. Certain features of the buffer stream 29 may, however, be approximately obtained in the manner described below. The methods explained below are approximate and exemplary and are described here to demonstrate possible relationships between features of the buffer stream 29, features of the reactive stream 27, and geometric features of the reactor 12.

The characteristic velocity of the buffer stream 29 in the reactor 12 is preferably sufficiently large to advect hydrogen atoms diffusing from the reactive stream 27 out of the reactor 12 before they can reach the reactor wall 24. Also, or alternatively, this velocity is preferably sufficiently high enough to advect impurities generated at the wall. 24 out of the reactor 12 before the impurities can reach the crystal growth surface. A preferred minimum characteristic velocity of the buffer stream 29 in the reactor 12 can be calculated by equating two characteristic time constants. The first characteristic time constant is the time that it would take for the buffer stream 29 to advect along the length of the reactor 12 and is equal to the ratio of the length of the reactor 12 to the velocity of the buffer stream 29. The second characteristic time constant is the time that it would take for hydrogen to diffuse from the centerline of the reactor 12 to the reactor wall 24, and is equal to the ratio of the square of the radius of the reactor 12 to the diffusivity of hydrogen in the buffer stream 29. Alternatively, the second characteristic time constant may be the time that it would take for an impurity to diffuse from the reactor wall 24 to a radial location in the reactor 12 that is the same as the radial location of the outer periphery of the substrate wafer 14 on the wafer holder 26. This characteristic time constant would be equal to the square of the distance between the aforementioned radial location and the reactor wall 24 divided by the diffusivity of the impurity in the buffer stream 29. The smaller of the two alternative values for the second characteristic time constant is equated with the first characteristic time constant to yield an approximate value for the characteristic velocity of the buffer stream 29 in the reactor 12.

The thermal energy stored in the pre-heated buffer stream 29 is used to increase the temperature of the reactive stream 27 in the reactor 12 from low values, such as the room temperature, to the values for forming the desired material or materials in the reactive stream 27. The desired material(s) is(are) the material(s) for forming the desired crystal on the wafer 14. The magnitude of thermal energy stored in the pre-heated buffer stream 29 may be determined by the temperature of the buffer stream 29, mass flow rate of the buffer stream 29, and the thermodynamic properties of the buffer stream 29. The mass flow rate of the buffer stream 29 before entering the reactor 12 is determined by the characteristic velocity of the buffer stream 29, the cross sectional area through which the buffer stream 29 flows, and the density of the buffer stream 29. The thermal energy stored in the buffer stream 29 should be sufficiently large so that when some of this energy is transferred to the reactive stream 27, the average temperature of the reactive stream 27 and the buffer stream 29 remains in a temperature range for forming the desired material or materials in the reactive stream 27. Thus, the inlet temperature of the buffer stream 29 can be approximately obtained by equating the sum of the thermal energy of the buffer stream 29 and the reactive stream 27 before they enter the reactor 12 with the sum of the thermal energy of the buffer stream 29 and the reactive stream 27 after the buffer stream 29 has heated the reactive stream 27 to the desired temperature (range).

By way of an illustrative example, the geometric and processing parameters for a process for growth of SiC are presented below. These conditions were obtained by a detailed computer simulation and constitute a set of conditions that have been calculated to result in at least one order of magnitude reduction in the level of impurities in the grown crystal.

| | |
|---|---|
| Seed Diameter | 7.5 cm |
| Inner diameter of the reactor wall | 13.5 cm |
| Length of the reactor (from inlet opening to seed surface) | 21.6 cm |
| Diameter of the inlet nozzle for the reactive mixture stream | 5 cm |
| Width of the annular opening for the inflow of the buffer stream | 1 cm |
| Growth rate | 100 microns/hour |
| Inlet temperature of the buffer gas | 2500° C. |
| Average temperature at the growth surface | 2200° C. |
| Flow rate of helium in the reactive mixture | 1.76 slpm |
| Flow rate of silane in the reactive mixture | 0.017 slpm |
| Flow rate of propane in the reactive mixture | 0.0045 slpm |
| Flow rate of buffer stream helium | 20 slpm | where slpm stands for standard liters per minute.

Figure 5:
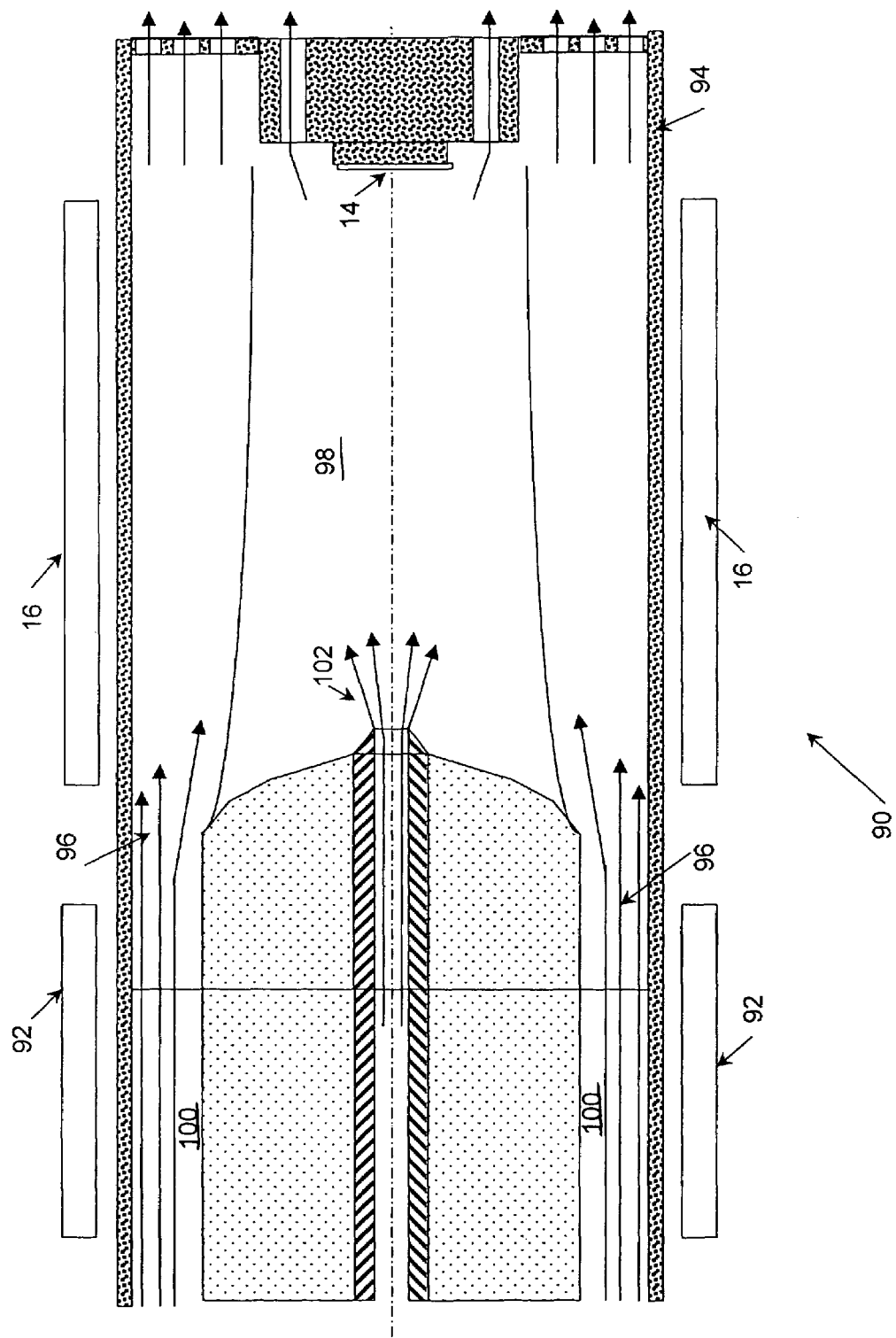
FIG. 5 is a cross-section of a reactor where a buffer gas stream is heated as it travels in an annular region prior to entering the reactor.

Referring to FIG. 5, another crystal growth system 90 includes an external pre-heating element 92. The pre-heating element 92 is disposed at the inlet end of a reactor 94 and is configured to pre-heat a buffer gas stream 96 before the stream 96 enters a reactor chamber 98. The element 92 may be any of a variety of heat sources such as a radio frequency (RF) inductor for heating the buffer gas stream 96, as it flows through an annular region 100 before entering the reactor chamber 98. The length and width of this annular region 100, and the size of the external heat source 92 is determined in concert with the other geometric and processing parameters of the growth system 90 to help ensure that before becoming in contact with a reactive stream 102, the buffer gas is heated to a sufficiently high temperature so that the buffer gas can heat the reactive mixture 102 to a desired temperature. The RF heating element 92 induces heat in graphite parts while not inducing heat (or at least not significantly so) in the seed 14.

Figure 6:
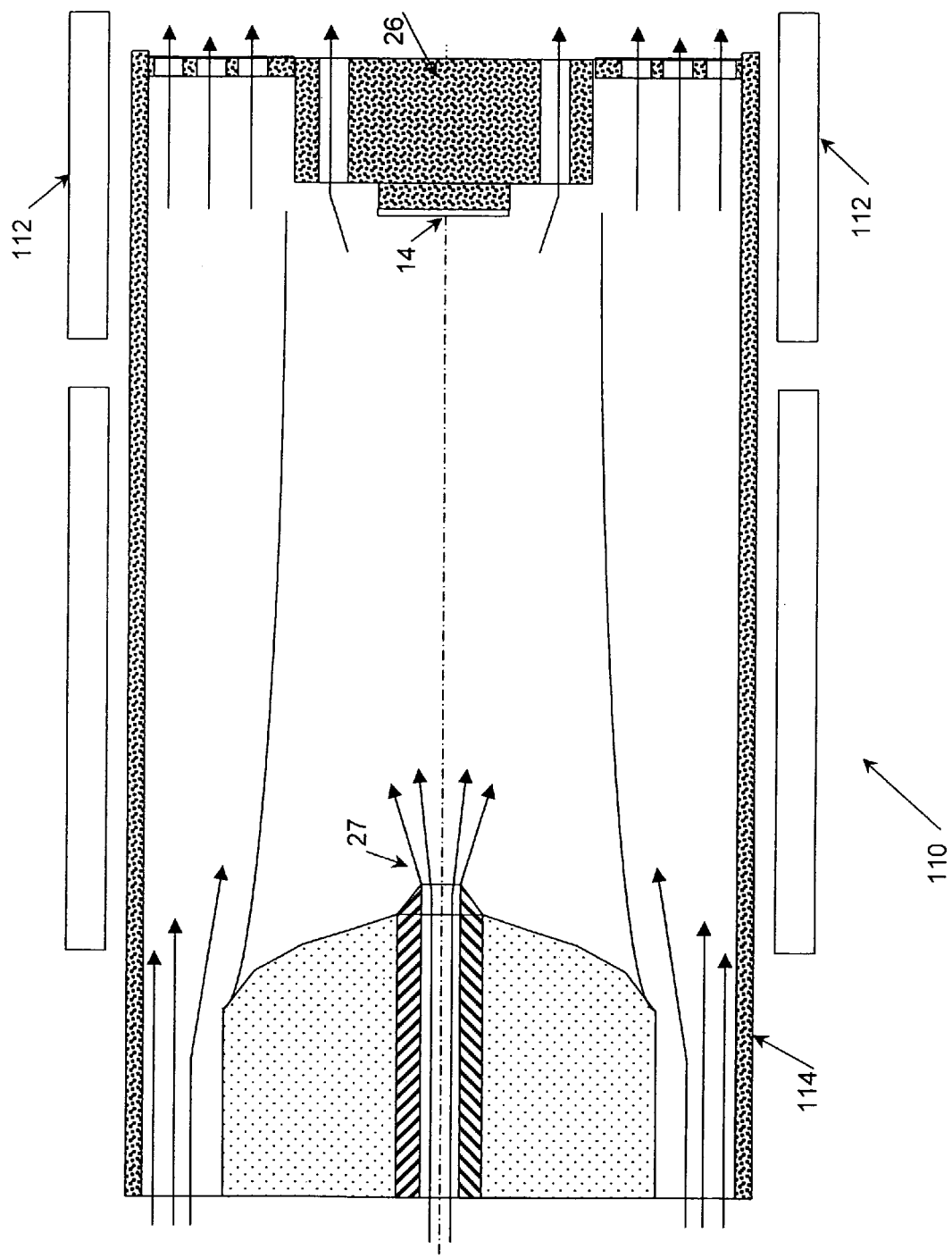
FIG. 6 is a cross-section of a reactor where an auxiliary heater is used to heat a region close to a seed and a seed-holder.

Referring to FIG. 6, another crystal growth system 110 includes an independent heat source 112 configured and disposed near the seed end of a reactor 114 to heat the region close to the seed 14, to heat the seed 14 itself, and to heat the seed holder 26. The source 112 provides independent control of the temperature distribution along the reactor wall and the temperature distribution around the seed 14. The source 112 provides for direct control of the difference between maximum temperature in the reactive gas 27 and the seed temperature, thereby providing a means to influence and control the rate of growth of SiC on the seed surface. Preferably, the difference, if any, between the maximum reactive stream temperature and the seed temperature is maintained between about 5° C. and about 200° C.

Figure 7:
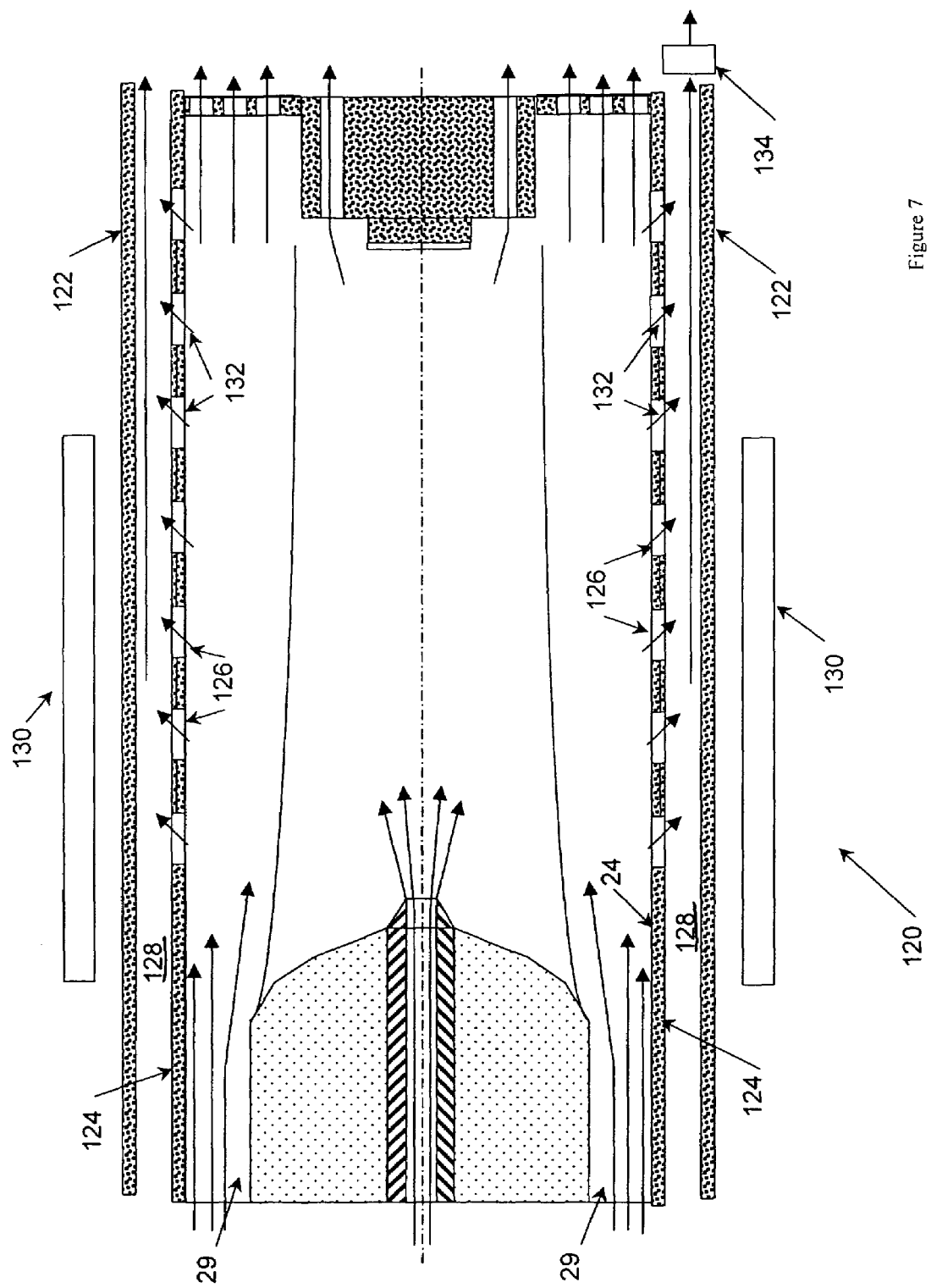
FIG. 7 is a cross-section of a reactor where a wall of the reactor provides openings through which a portion of a pre-heated buffer gas stream flows into an annular region feeding an exhaust port for advection of impurities generated at the reactor wall.

Referring to FIG. 7, another crystal growth system 120 includes a cylindrical structure 122 and a reactor 124 having multiple openings 126 through the reactor wall along the reactor's length. The cylindrical structure 122 is disposed around the reactor wall, providing an annular conduit region 128 between the reactor 124 and the structure 122. An RF heating source 130 is disposed outside of the cylindrical structure 122. The cylindrical structure 122 is preferably constructed of a material, for example quartz, that would not couple (at least not significantly so) with the RF inductor 130 so that all or substantially all of the heating action induced by the RF inductor 130 occurs in the reactor wall 24. The annular conduit region 128 is in fluid communication with a vacuum pump 134 (or other device, e.g., a fan) that produces a negative pressure relative to the pressure in the reactor 124. Thus, certain amounts of the buffer stream 29 will flow through the openings 126 into the conduit region 128, as indicated by arrows 132, and out of the conduit region (passageway) 128. The size(s) of the openings 126 may be varied along the length of the reactor wall 24, e.g., to help control the variation of the flow rate of the buffer stream 29 through the openings 126 along the reactor wall 24. The buffer gas 29 removes impurities generated at the reactor wall 24, through the openings 126 in the reactor wall 24. This reactor configuration may be particularly useful for circumstances when impurities generation at the reactor wall is caused by auto-release of impurities.

Figure 8:
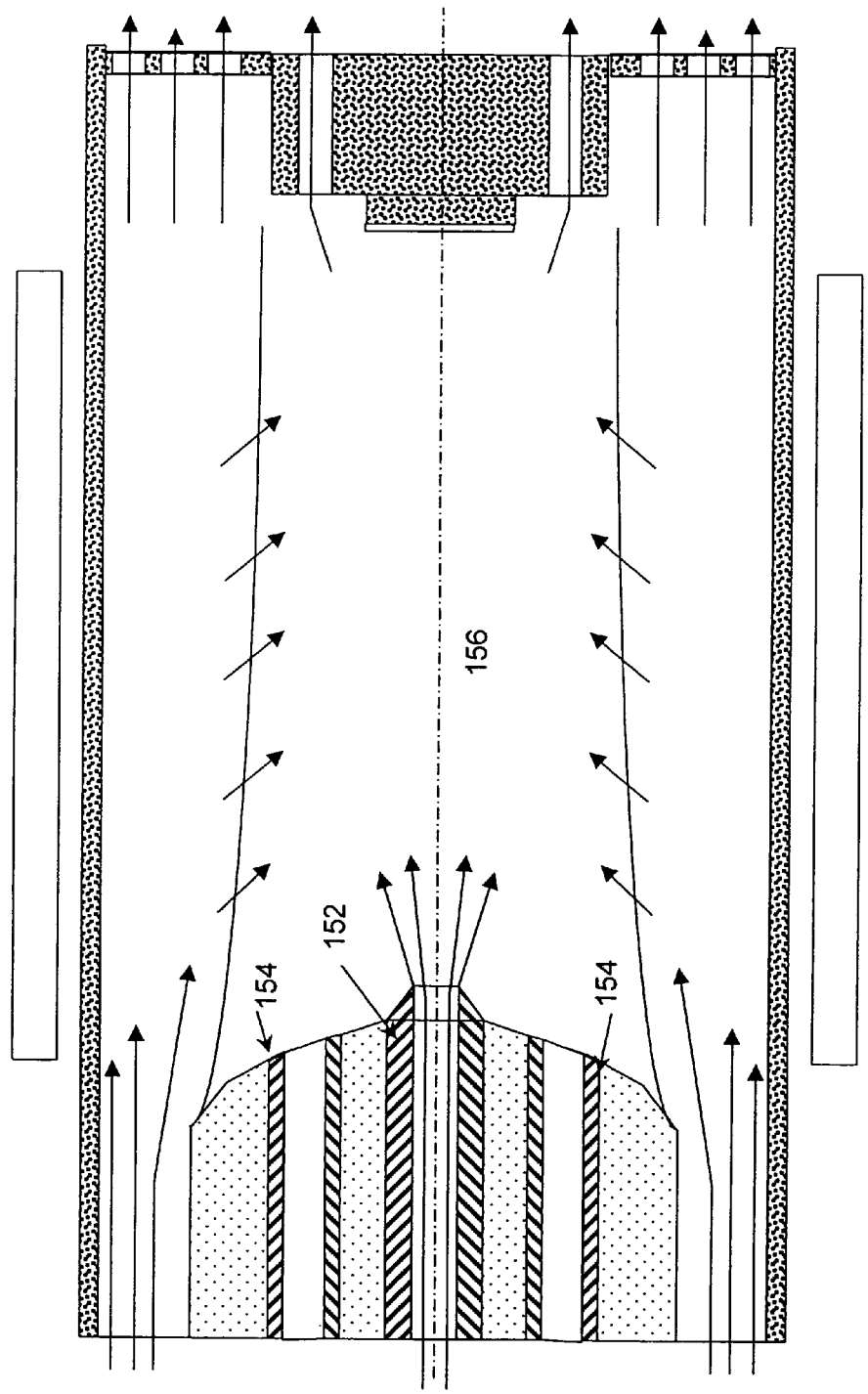
FIG. 8 is a cross-section of a reactor having multiple, different-length inlet tubes configured to introduce reactive gases into the reactor at different depths.

Other embodiments are within the scope and spirit of the invention. For example, an etchant gas, such as hydrogen, may be added to the reactive gas stream 27 before it is introduced into the reactor. The pre-heated buffer stream 27 may be chosen so as to react with components in the reactive mixture to form an inert and stable compound that is advected out of the reactor by the buffer stream. For example, the buffer stream 27 may react with the hydrogen released during chemical reactions of the reactive gases, etchants in the reactive stream 29, or the reactive gases themselves to form inert and stable compounds. The buffer gas(es) may similarly react with impurities released from, or other products of reactions with, the reactor wall. The pre-heated buffer stream may be chosen so as to react with the impurities released from the reactor to form an inert and stable compound that is advected out of the reactor by the buffer stream. The growing crystals may be doped in controlled amounts by introducing appropriate amounts of dopant carrying gases into the reactive stream. A dopant may be used to influence the properties of the grown material. The dopant gas may be added to the reactive gas mixture at the inlet to the reactor. The dopant is advected towards the seed 14 by the bulk motion of the reactive gas mixture 27 and is incorporated into the growing crystal. Some of the dopant also diffuses into the buffer stream 29 and is advected out of the reactor. The concentration of the dopant in the reactive mixture at the inlet is chosen in concert with geometric features and processing parameters of the reactor so that a desired level of doping at the growth surface is obtained. An external heater may be used to pre-heat the buffer stream and the reactor wall, e.g., simultaneously performing functions of the heaters 16, 92 shown in FIG. 5. Further, while all reactive gas constituents have been described as being mixed before introduction into the reactor/reactor chamber, one or more of the reactive gas components may be introduced into the stream separately from the introduction of one or more other components into the reactor/reactor chamber. For example, referring to FIG. 8, multiple separate inlet tubes 152, 154 for reactive gases may be used. Further, the inlet tube 152 for one or more of the reactive gases may have a different length and may release its gases into a reactive chamber 156 at a different depth than the inlet tube 154 for one or more of the reactive gases.

Still further embodiments are within the scope and spirit of the invention as embodied in the appended claims.

What is claimed is:

1. A reactor system for growing a crystal on a substrate, the reactor system comprising:

a housing comprising a first, inlet end, and a second, outlet end, the inlet end defining a reactive stream intake port and a buffer stream intake port, the outlet end defining at least one output port;

a base coupled to the outlet end of the housing and configured to receive the substrate;

a reactive gas injector configured to inject reactive gases into the housing through the reactive stream intake port to produce a reactive stream of the reactive gases;

a buffer gas injector configured to inject buffer gas into the housing through the buffer stream intake port to produce a buffer stream of the buffer gas; and a first heat source configured and disposed to heat the buffer stream;

wherein the inlet end, the reactive gas injector, and the buffer gas injector are configured such that the heated buffer stream is disposed between the reactive stream and a wall of the housing and inhibits components of or produced in the reactive stream from reaching the housing wall and inhibits materials produced or emitted by the housing wall from reaching the reactive stream before the reactive stream reaches the substrate, and the first heat source is configured to heat the buffer stream to a sufficient temperature such that when the buffer stream interacts with the reactive stream, the buffer stream will heat the reactive stream enough to cause the reactive gases to react with each other to form a desired material before reaching the substrate, the desired material for forming a desired crystal on the substrate.

2. The system of claim 1 wherein the inlet end is configured to keep the reactive stream and the heated buffer stream separate until an interaction location inside the housing.

3. The system of claim 2 further comprising a second heat source configured and disposed to heat the housing wall substantially between points even with the interaction location and the substrate.

4. The system of claim 1 further comprising a substrate-heating source configured and disposed to heat the substrate to maintain a temperature difference between a temperature of the reactive stream and a temperature of the substrate.

5. The system of claim 4 wherein the difference is maintained between about 5° C. and about 200° C.

6. The system of claim 1 wherein the housing defines at least one opening in the housing wall along a length of the housing.

7. The system of claim 6 wherein the housing defines a plurality of openings in the housing wall along the length of the housing and wherein sizes of the openings provide modulated outflow of at least the buffer gas from the housing along the length of the housing.

8. The system of claim 7 further comprising:

an outer shell disposed about and separated from the housing along the length of the housing to define a passageway between the shell and the housing; and an apparatus configured and disposed to induce flow of gas out of the passageway.

9. A reactor system for growing a crystal on a substrate, the reactor system comprising:

a housing comprising a first, inlet end, and a second, outlet end, the inlet end defining a reactive stream intake port, the outlet end defining at least one output port;

a base coupled to the outlet end of the housing and configured to receive the substrate;

an apparatus configured and disposed to provide a gas flow into the housing through the reactive stream intake port; and means for heating the gas flow between the intake port and the substrate and for isolating at least one gas flow components from a wall of the housing and materials emitted from the housing wall from the gas flow, wherein the means for heating the gas flow is configured to do so independently of heat emanating from the housing wall, and the means for heating is configured to inject a heated stream of at least one buffer gas that is unlikely to react with the gas flow components, the at least one buffer gas being at a sufficient temperature to heat the gas flow components enough such that gas flow components will react with each other.

10. The system of claim 9 further comprising means for heating the housing wall.

11. The system of claim 10 further comprising means for heating the substrate to maintain a desired temperature difference between a maximum temperature of the gas flow and a temperature of the substrate.

12. The system of claim 11 wherein the desired temperature difference is between about 5° C. and about 200° C.

13. The system of claim 9 wherein the housing defines at least one opening in the housing wall along a length of the housing.

14. The system of claim 13 wherein the housing defines a plurality of openings in the housing wall with different sizes along the length of the housing.

15. The system of claim 9 further comprising:

an outer shell disposed about and separated from the housing along the length of the housing to define a passageway between the shell and the housing; and an apparatus configured and disposed to induce flow of gas out of the passageway.

* * * * *